United States Patent
Kung

(10) Patent No.: US 10,261,116 B2
(45) Date of Patent: Apr. 16, 2019

(54) APPARATUS FOR PERFORMING RESISTANCE CONTROL ON A CURRENT SENSING COMPONENT IN AN ELECTRONIC DEVICE, AND ASSOCIATED METHOD

(71) Applicant: MEDIATEK INC., Hsin-Chu (TW)

(72) Inventor: Nien-Hui Kung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 563 days.

(21) Appl. No.: 15/050,446

(22) Filed: Feb. 22, 2016

(65) Prior Publication Data
US 2017/0023626 A1    Jan. 26, 2017

Related U.S. Application Data

(60) Provisional application No. 62/195,935, filed on Jul. 23, 2015.

(51) Int. Cl.
  *G01R 19/32* (2006.01)
  *G01R 19/00* (2006.01)
  (Continued)

(52) U.S. Cl.
  CPC ......... *G01R 19/32* (2013.01); *G01R 19/0092* (2013.01); *H03K 17/0822* (2013.01);
  (Continued)

(58) Field of Classification Search
  CPC ............... G01R 19/32; G01R 19/0092; H03K 17/0822; H03K 17/145; H03K 17/687; H03K 2217/0027
  (Continued)

(56) References Cited

U.S. PATENT DOCUMENTS 8,040,167 B1 * 10/2011 Lin .................. H03L 7/0895
                                                        327/148
9,000,750 B2    4/2015 Yu
(Continued)

FOREIGN PATENT DOCUMENTS

CN        101825909 A      9/2010
CN        102013797 A      4/2011
(Continued)

OTHER PUBLICATIONS

Gerrit W. den Besten and Bram Nauta, Member, IEEE, Embedded 5 V-to-3.3 V Voltage Regulator for Supplying Digital IC's in 3.3 V CMOS Technology, IEEE Journal of Solid-State Circuits, vol. 33, No. 7, XP055402932, Jul. 1998, pp. 956-962.

*Primary Examiner* — Melissa J Koval
*Assistant Examiner* — Rahul Maini
(74) *Attorney, Agent, or Firm* — Winston Hsu

(57) ABSTRACT

An apparatus for performing resistance control on a current sensing component in an electronic device and an associated method are provided. For example, the apparatus may comprise a power switching unit and a feedback module, and the power switching unit is utilized as the current sensing component when the power switching unit enables the power path. The feedback module may comprise: a power switching unit replica that receives a first voltage at the battery terminal and outputs a second voltage; a first current source, coupled between the power switching unit replica and a ground terminal, arranged to receive the second voltage; a reference voltage generator that generates a third voltage; and an error amplifier that receives the second voltage and the third voltage and outputs a fourth voltage, wherein the feedback module controls both of the power switching unit and the power switching unit replica according to the fourth voltage.

20 Claims, 10 Drawing Sheets

(51) Int. Cl.
*H03K 17/687* (2006.01)
*H03K 17/082* (2006.01)
*H03K 17/14* (2006.01)

(52) U.S. Cl.
CPC ......... *H03K 17/145* (2013.01); *H03K 17/687* (2013.01); *H03K 2217/0027* (2013.01)

(58) Field of Classification Search
USPC ........................................................ 324/105
See application file for complete search history.

(56) References Cited

U.S. PATENT DOCUMENTS

2006/0091961 A1    5/2006  Briskin
2015/0366028 A1* 12/2015  Jao ....................... H05B 33/083
                                                                              315/185 R

FOREIGN PATENT DOCUMENTS

| EP | 1 115 203 A1 | 7/2001 |
|---|---|---|
| EP | 1115203 A1 | 7/2001 |
| JP | 200710372 A | 1/2007 |
| JP | 2007010372 A | 1/2007 |

* cited by examiner

APPARATUS FOR PERFORMING RESISTANCE CONTROL ON A CURRENT SENSING COMPONENT IN AN ELECTRONIC DEVICE, AND ASSOCIATED METHOD

CROSS REFERENCE TO RELATED APPLICATIONS

This application claims the benefit of U.S. Provisional Application No. 62/195,935, which was filed on Jul. 23, 2015, and is included herein by reference.

BACKGROUND

The present invention relates to maintaining the on resistance of a power Metal Oxide Semiconductor Field Effect Transistor (MOSFET) on a power path of a portable electronic device at a constant resistance value for current sensing, and more particularly, to an apparatus for performing resistance control on a current sensing component in an electronic device, and an associated method.

According to the related art, a conventional power management integrated circuit (PMIC) in a conventional portable electronic device may be designed to have a power MOSFET on a power path between a battery and a conventional system circuit within the conventional portable electronic device, for selectively enabling or disabling the power path by turning on or off the power MOSFET in different situations. When the power MOSFET is turned on, the on resistance of the power MOSFET may vary with respect to temperature, and therefore can hardly be utilized for current sensing. A conventional method is proposed to maintain the on resistance of the power MOSFET in order to utilize the power MOSFET as a replacement of a conventional current sensing component such as an off-chip current sensing resistor. However, further problems such as some side effects may occur. For example, some additional components implemented for on resistance control according to the conventional method may cause an unstable problem of the conventional PMIC. In addition, the temperature coefficient of the on resistance of the power MOSFET may be impacted by the output performance of one or more of the additional components mentioned above. Thus, a novel architecture is required to control the on resistance of a power MOSFET on a power path within an electronic device at a constant resistance value for current sensing with fewer side effects, and to guarantee the overall performance of the electronic device.

SUMMARY

It is an objective of the claimed invention to provide an apparatus for performing resistance control on a current sensing component in an electronic device, and an associated method, in order to solve the above-mentioned problems.

It is another objective of the claimed invention to provide an apparatus for performing resistance control on a current sensing component in an electronic device, and an associated method, in order to control the resistance of the current sensing component (e.g. the on resistance of a power Metal Oxide Semiconductor Field Effect Transistor (MOSFET) on a power path within the electronic device) at a constant resistance value for current sensing with fewer side effects, and to guarantee the overall performance of the electronic device.

According to at least one preferred embodiment, an apparatus for performing resistance control on a current sensing component in an electronic device is provided, where the apparatus may comprise at least one portion (e.g. a portion or all) of the electronic device. For example, the apparatus may comprise a power switching unit that is positioned within the electronic device, and may comprise a feedback module that is coupled to the power switching unit and positioned within the electronic device. The power switching unit may be arranged to selectively enable or disable a power path between a system terminal and a battery terminal within the electronic device, wherein the system terminal is utilized for coupling a main system circuit of the electronic device, and the battery terminal is utilized for coupling a battery of the electronic device, wherein the power switching unit is utilized as the current sensing component when the power switching unit enables the power path, and the current sensing component measures current on the power path. In addition, the feedback module comprises: a power switching unit replica that receives a first voltage at the battery terminal and outputs a second voltage; a first current source, coupled between the power switching unit replica and a ground terminal, arranged to receive the second voltage; a reference voltage generator that generates a third voltage; an error amplifier that receives the second voltage and the third voltage and outputs a fourth voltage, wherein the feedback module controls both of the power switching unit and the power switching unit replica according to the fourth voltage; and a pull-high component (e.g. a second current source or a resistor), coupled between an output terminal of the error amplifier and a predetermined voltage terminal, arranged to receive the fourth voltage and operate according to a specific voltage at the predetermined voltage terminal.

According to at least one preferred embodiment, a method for performing resistance control on the current sensing component in the electronic device with the above apparatus is provided, where the method may be applied to the above apparatus and the electronic device. The method may comprise the steps of: measuring a voltage difference between the system terminal and the battery terminal within the electronic device; and based on a set of calibration data, performing a mapping operation according to the voltage difference to obtain a current value, and adjust a control current of the first current source according to the current value. For example, the method may further comprise: performing calibration on the control current of the first current source in a calibration flow to generate the set of calibration data.

According to at least one preferred embodiment, an apparatus for performing resistance control on a current sensing component in an electronic device is provided, where the apparatus may comprise at least one portion (e.g. a portion or all) of the electronic device. For example, the apparatus may comprise a power switching unit that is positioned within the electronic device, and may comprise a feedback module that is coupled to the power switching unit and positioned within the electronic device. The power switching unit may be arranged to selectively enable or disable a power path between a system terminal and a battery terminal within the electronic device, wherein the system terminal is utilized for coupling a main system circuit of the electronic device, and the battery terminal is utilized for coupling a battery of the electronic device, wherein the power switching unit is utilized as the current sensing component when the power switching unit enables the power path, and the current sensing component measures current on the power path. In addition, the feedback module comprises: a power switching unit replica that receives a first voltage at the battery terminal and outputs a second voltage; a first current source, coupled between the power switching unit replica and a predetermined voltage terminal, arranged to receive the second voltage and operate according to a specific voltage at the predetermined voltage terminal; a reference voltage generator that generates a third voltage, wherein the reference voltage generator comprises a second current source and a resistor that are connected in series and are coupled between the predetermined voltage terminal and the battery terminal, wherein the third voltage is output from a terminal between the second current source and the resistor; an error amplifier that receives the second voltage and the third voltage and outputs a fourth voltage, wherein the feedback module controls both of the power switching unit and the power switching unit replica according to the fourth voltage; and a pull-high component (e.g. a third current source or a resistor), coupled between an output terminal of the error amplifier and the predetermined voltage terminal, arranged to receive the fourth voltage and operate according to the specific voltage.

According to at least one preferred embodiment, an apparatus for performing resistance control on a current sensing component in an electronic device is provided, where the apparatus may comprise at least one portion (e.g. a portion or all) of the electronic device. For example, the apparatus may comprise a power switching unit that is positioned within the electronic device, and may comprise a feedback module that is coupled to the power switching unit and positioned within the electronic device. The power switching unit may be arranged to selectively enable or disable a power path between a system terminal and a battery terminal within the electronic device, wherein the system terminal is utilized for coupling a main system circuit of the electronic device, and the battery terminal is utilized for coupling a battery of the electronic device, wherein the power switching unit is utilized as the current sensing component when the power switching unit enables the power path, and the current sensing component measures current on the power path. In addition, the feedback module comprises: a power switching unit replica that receives a first voltage at the battery terminal and outputs a second voltage; a first current source, coupled between the power switching unit replica and a ground terminal, arranged to receive the second voltage; a reference voltage generator that generates a third voltage, wherein the reference voltage generator comprises a resistor and a second current source that are connected in series and are coupled between the first voltage and the ground terminal, wherein the third voltage is output from a terminal between the resistor and the second current source; an error amplifier that receives the second voltage and the third voltage and outputs a fourth voltage, wherein the feedback module controls both of the power switching unit and the power switching unit replica according to the fourth voltage; and a pull-high component (e.g. a third current source or a resistor), coupled between an output terminal of the error amplifier and a predetermined voltage terminal, arranged to receive the fourth voltage and operate according to a specific voltage at the predetermined voltage terminal.

It is an advantage of the present invention that the present invention apparatus and method can keep high stability of the electronic device in each of various situations, and the related art problems will no longer be an issue. In addition, the present invention apparatus and method can control the resistance of the current sensing component such as the on resistance of the power MOSFET at a constant resistance value for current sensing with fewer side effects, and to guarantee the overall performance of the electronic device. As a result, the power MOSFET may be equipped with constant on resistance (Ron) and low temperature coefficient (TC), and therefore can be utilized as a high accuracy sensing resistor combined with a high current path. Additionally, the associated costs (e.g. the labor cost and the manufacturing cost) regarding the off-chip current sensing resistor can be reduced, with fewer side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
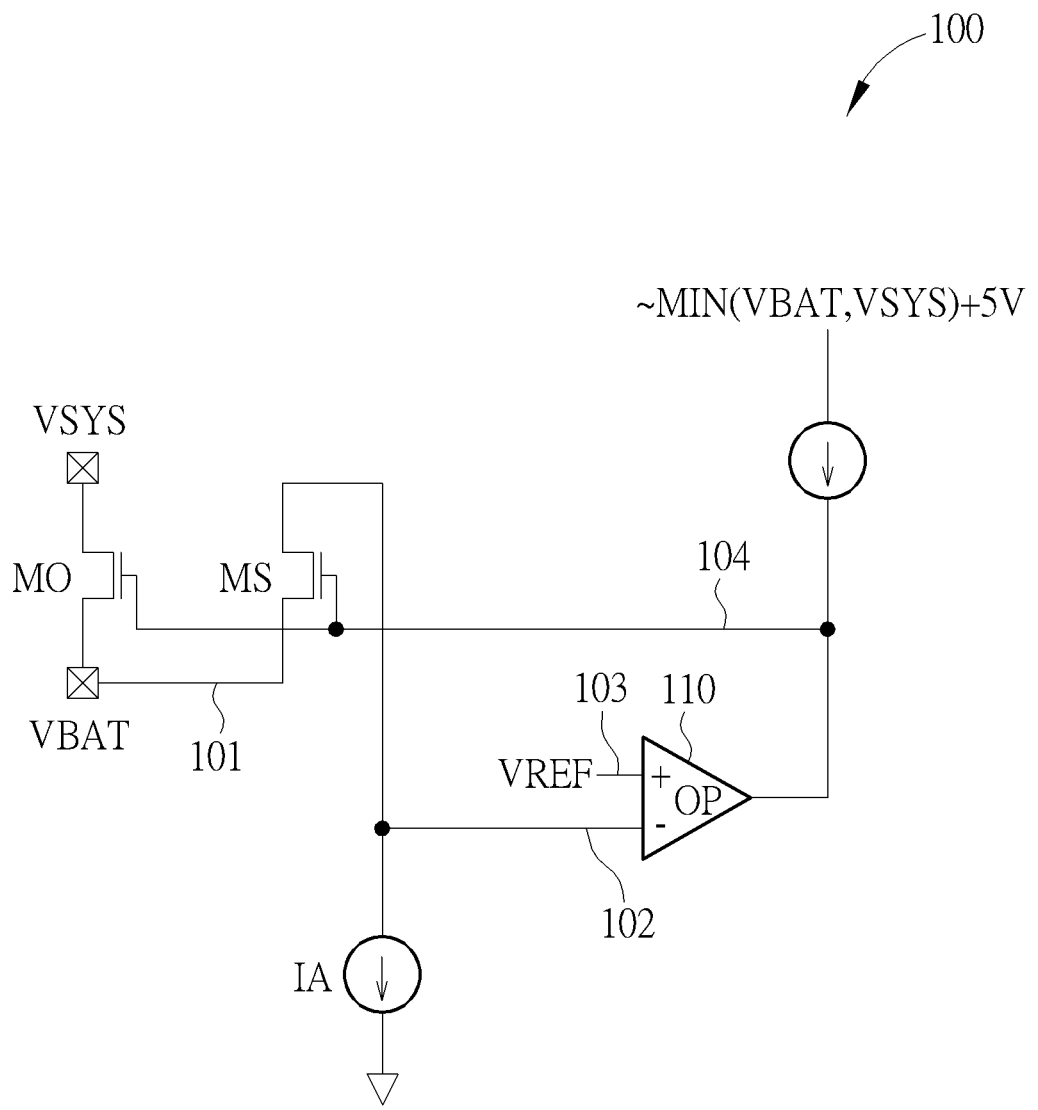
FIG. 1 is a diagram of an apparatus for performing resistance control on a current sensing component in an electronic device according to an embodiment of the present invention.

FIG. 1 is a diagram of an apparatus 100 for performing resistance control on a current sensing component in an electronic device according to an embodiment of the present invention, where the apparatus 100 may comprise at least one portion (e.g. a portion or all) of the electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. a wireless communications system comprising the electronic device). Examples of the electronic device may include, but not limited to, a mobile phone (e.g. a multifunctional mobile phone), a tablet, and a personal computer such as a laptop computer or a desktop computer.

According to this embodiment, the apparatus 100 may comprise a power switching unit that is positioned within the electronic device, and may comprise a feedback module that is coupled to the power switching unit and positioned within the electronic device. For example, the power switching unit may comprise a Field Effect Transistor (FET) such as the Metal Oxide Semiconductor Field Effect Transistor (MOSFET) MO. As shown in FIG. 1, the power switching unit (e.g. the MOSFET MO) may be arranged to selectively enable or disable a power path between a system terminal VSYS and a battery terminal VBAT within the electronic device, where the system terminal VSYS is utilized for coupling a main system circuit of the electronic device, and the battery terminal VBAT is utilized for coupling a battery of the electronic device. For example, the power switching unit (e.g. the MOSFET MO) may be utilized as the current sensing component when the power switching unit enables the power path, and the current sensing component measures current on the power path.

More particularly, the feedback module of this embodiment may comprise a power switching unit replica (e.g. a FET such as the MOSFET MS) that receives a first voltage 101 at the battery terminal VBAT and outputs a second voltage 102, and a first current source IA that is coupled between the power switching unit replica (e.g. the MOSFET MS) and a ground terminal, where the first current source IA may be arranged to receive the second voltage. In addition, the feedback module may further comprise a reference voltage generator that generates a third voltage 103 such as a reference voltage VREF, and an error amplifier 110 (e.g. an operational amplifier, labeled "OP" in FIG. 1 for better comprehension) that receives the second voltage 102 and the third voltage 103 and outputs a fourth voltage 104, where the feedback module controls both of the power switching unit (e.g. the MOSFET MO) and the power switching unit replica (e.g. the MOSFET MS) according to the fourth voltage 104. For example, the error amplifier 110 may comprise a monitoring input terminal (e.g. the negative terminal of the error amplifier 110 in this embodiment) for receiving the second voltage 102, and further comprises a reference input terminal (e.g. the positive terminal of the error amplifier 110 in this embodiment) for receiving the third voltage 103. Additionally, the feedback module may further comprise a pull-high component such as a second current source (e.g. the current source shown around the upper right corner of FIG. 1), and the pull-high component such as the second current source of this embodiment is coupled between the output terminal of the error amplifier 110 and a predetermined voltage terminal (e.g. the upper terminal of this current source shown in FIG. 1), where the pull-high component such as the second current source of this embodiment may be arranged to receive the fourth voltage 104 and operate according to a specific voltage at the predetermined voltage terminal. For example, the specific voltage is greater than a minimum within the first voltage 101 at the battery terminal VBAT and a fifth voltage at the system terminal VSYS (labeled "MIN(VBAT, VSYS)" in FIG. 1, for brevity). In practice, the apparatus 100 may generate the specific voltage to be the minimum plus a positive voltage such as 5 volts (V). This is for illustrative purposes only, and is not meant to be a limitation of the present invention. According to some embodiments of the present invention, the positive voltage may vary. Examples of this positive voltage may include, but not limited to, 1 V, 2 V, 3 V, 4 V, or any of other voltage values. In some embodiments, such as the embodiment shown in FIG. 1 and some of the following embodiments, as the minimum plus the positive voltage such as that around 5 V is surely high enough to drive the pull-high component such as the second current source of this embodiment (e.g. the current source shown around the upper right corner of FIG. 1), when the specific voltage is approximately the minimum plus 5 V (labeled "~MIN(VBAT, VSYS)+5V" in FIG. 1, for brevity), the operations of the architecture shown in FIG. 1 will not be hindered. According to some embodiments of the present invention, the pull-high component of the apparatus 100 may be implemented with a resistor, where the second current source of the embodiment shown in FIG. 1 may be replaced by this resistor.

As mentioned, the power switching unit (e.g. the MOSFET MO) may be utilized as the current sensing component when the power switching unit enables the power path, where the feedback module may track the temperature of the current sensing component and modulates the resistance of the current sensing component based on the tracked temperature. Please note that the output terminal of the error amplifier 110 is directly connected to a control terminal of the power switching unit, such as the gate of the MOSFET MO, and the feedback module regulates the resistance of the current sensing component, such as the on resistance of the MOSFET MO, by applying the fourth voltage 104 to the control terminal (e.g. the gate of the MOSFET MO). Thus, the apparatus 100 may use a single amplifier in the tracking loop of the feedback module (e.g. the error amplifier 110 shown in FIG. 1) to achieve the goal of better stability and temperature coefficient (TC) performance.

According to some embodiments, the first current source IA may be made by a low TC architecture, and the reference voltage VREF may be programmable to adjust the on resistance of the power switching unit (e.g. the MOSFET MO). According to some embodiments, the reference voltage VREF may be related to the first voltage 101 at the battery terminal VBAT, and the apparatus 100 may regulate the voltage drop on the MOSFET MS to be constant.

According to some embodiments, the power switching unit may be implemented with one of other types of FETs. According to some embodiments, the power switching unit replica may be implemented with one of other types of FETs.

Figure 2:
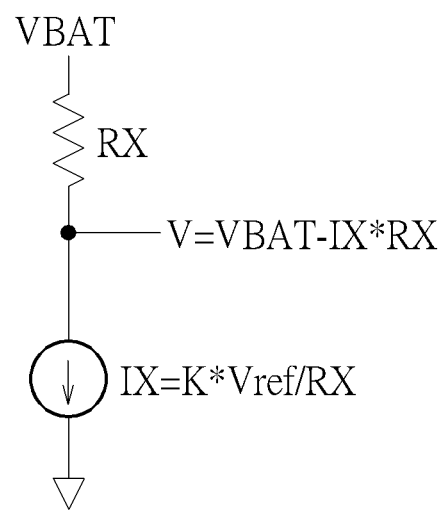
FIG. 2 illustrates a control scheme involved with the apparatus shown in FIG. 1 according to an embodiment of the present invention.

FIG. 2 illustrates a control scheme involved with the apparatus 100 shown in FIG. 1 according to an embodiment of the present invention. According to this embodiment, the reference voltage generator mentioned in the embodiment shown in FIG. 1 may comprise a reference output terminal for outputting the reference voltage VREF (e.g. the predetermined voltage Vref in this embodiment), where the reference voltage VREF is utilized as the third voltage 103. For example, the reference voltage generator may comprise a first resistor RX and a third current source IX that are connected in series, where the first resistor RX is coupled between the battery terminal VBAT and the reference output terminal, and the third current source IX is coupled between the reference output terminal and the ground terminal. Based upon the architecture shown in FIG. 2, the voltage V at the terminal between the first resistor RX and the third current source IX can be expressed as follows:

$$V=VBAT-IX*RX;$$

where the voltage value at the battery terminal VBAT, the current value of the third current source IX, and the resistance value of the resistor RX may be expressed with the corresponding notations thereof in the above equation, for better comprehension.

According to this embodiment, as the terminal between the first resistor RX and the third current source IX may be utilized as the reference output terminal for outputting the reference voltage VREF, the voltage V in the above equation can be taken as an example of the reference voltage VREF (i.e., VREF=VBAT−IX*RX). In addition, the reference voltage VREF and the voltage at the battery terminal VBAT may have a positive correlation. Additionally, the current value of the third current source IX may be designed to comply with the following equation:

$$IX=K*Vref/RX;$$

where the notation K can be a predetermined constant. This is for illustrative purposes only, and is not meant to be a limitation of the present invention.

Figure 3:
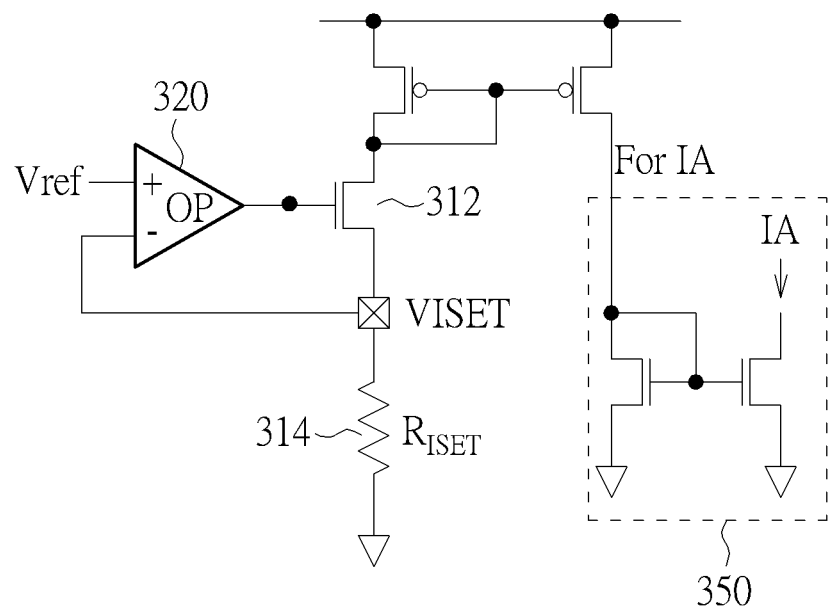
FIG. 3 illustrates some implementation details of the control scheme shown in FIG. 2 according to an embodiment of the present invention.

FIG. 3 illustrates some implementation details of the control scheme shown in FIG. 2 according to an embodiment of the present invention, where the architecture shown in FIG. 3 can be taken as an example of the first current source IA. This is for illustrative purposes only, and is not meant to be a limitation of the present invention. For example, the architecture of the first current source IA may vary.

As shown in FIG. 3, the first current source IA may comprise a MOSFET 312 and a resistor 314 that are connected in series, where the resistor 314 may have the resistance value $R_{ISET}$. In addition, the first current source IA may further comprise an amplifier 320 (e.g. an operational amplifier, labeled "OP" in FIG. 3 for better comprehension) that receives the third voltage (e.g. the reference voltage VREF such as the predetermined voltage Vref) as a reference signal and monitors a monitoring input signal at the terminal VISET between the MOSFET 312 and the resistor 314 and controls the gate of the MOSFET 312 with the output signal of the amplifier 320. Additionally, the first current source IA may further comprise a current conversion circuit which comprises the remaining components with the architecture shown in FIG. 3, where the current conversion circuit is coupled to the MOSFET 312, and is arranged to control the current of the first current source IA according to the current passing through the MOSFET 312. Further, the partial circuit 350 of the current conversion circuit of this embodiment may provide the current of the first current source IA, where the current of the first current source IA is labeled with the corresponding notation thereof in the partial circuit 350 shown in FIG. 3, for better comprehension.

According to some embodiments, the apparatus 100 may use the resistance value $R_{ISET}$ of the resistor 314 to regulate the resistance of the current sensing component, such as the on resistance of the MOSFET MO. As the current of the third current source IX and the reference voltage VREF such as the predetermined voltage Vref may have positive correlation, the resistance of the current sensing component (such as the on resistance of the MOSFET MO) and the resistance value $R_{ISET}$ of the resistor 314 may have positive correlation.

Figure 4:
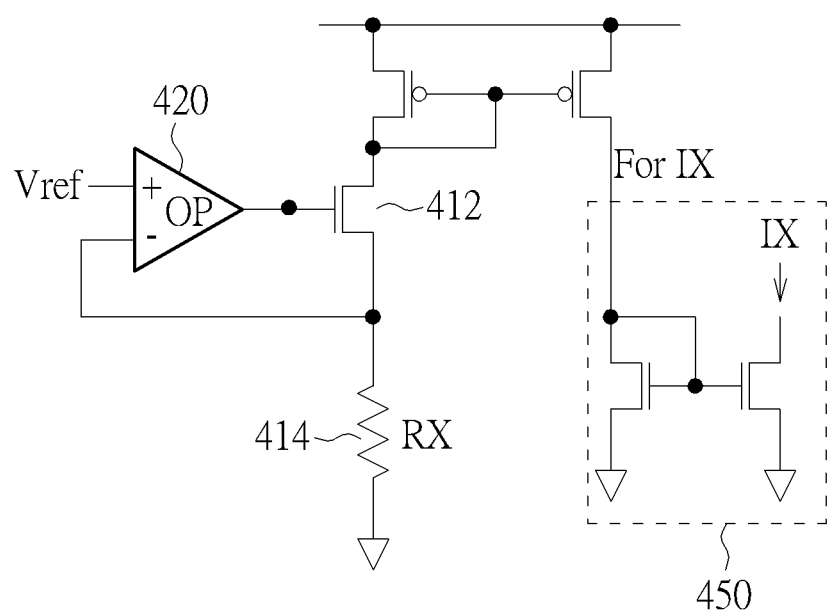
FIG. 4 illustrates some implementation details of the control scheme shown in FIG. 2 according to another embodiment of the present invention.

FIG. 4 illustrates some implementation details of the control scheme shown in FIG. 2 according to another embodiment of the present invention, where the architecture shown in FIG. 4 can be taken as an example of the third current source IX. This is for illustrative purposes only, and is not meant to be a limitation of the present invention. For example, the architecture of the third current source IX may vary.

As shown in FIG. 4, the third current source IX may comprise a MOSFET 412 and a resistor 414 that are connected in series, where the resistor 414 may have the same resistance value as that of the first resistor RX, and therefore is labeled "RX" in FIG. 4 for better comprehension. In addition, the third current source IX may further comprise an amplifier 420 (e.g. an operational amplifier, labeled "OP" in FIG. 4 for better comprehension) that receives the third voltage (e.g. the reference voltage VREF such as the predetermined voltage Vref) as a reference signal and monitors a monitoring input signal at the terminal between the MOSFET 412 and the resistor 414 and controls the gate of the MOSFET 412 with the output signal of the amplifier 420. Additionally, the third current source IX may further comprise a current conversion circuit which comprises the remaining components with the architecture shown in FIG. 4, where the current conversion circuit is coupled to the MOSFET 412, and is arranged to control the current of the third current source IX according to the current passing through the MOSFET 412. Further, the partial circuit 450 of the current conversion circuit of this embodiment may provide the current of the third current source IX, where the current of the third current source IX is labeled with the corresponding notation thereof in the partial circuit 450 shown in FIG. 4, for better comprehension.

Based on the control scheme shown in FIG. 2, the apparatus 100 may use a single amplifier in the tracking loop of the feedback module to achieve the goal of better stability and TC performance. Please note that, in the conventional PMIC of the related art, a resistor used in the conventional method for maintaining the on resistance of the power MOSFET thereof to be constant typically operates in a fly domain with respect to a non-zero voltage level at its battery terminal VBAT, and therefore the accuracy of this resistor implemented within the PMIC chip is critical, and how to guarantee the accuracy of this resistor during manufacturing the conventional PMIC has become an issue. In comparison with this, the present invention apparatus (e.g. the apparatus 100, etc.) will not suffer from the problems regarding the resistor of the conventional PMIC.

For example, according to some embodiments of the present invention, a resistor (e.g. the resistor 314 that may have the resistance value $R_{ISET}$) for maintaining the on resistance of the power switching unit (e.g. the MOSFET MO) to be constant typically operates in a non-fly domain with respect to a zero voltage level at the ground terminal, and therefore the accuracy of this resistor is non-critical, and the voltage coefficients of this resistor may easily be tuned in process during a manufacturing phase (e.g. through one or more combinations of different materials, without many efforts, since it is non-critical). More particularly, in a situation where the architecture shown in FIG. 2 and the architecture shown in FIG. 4 are applied to the apparatus 100, the terms of resistance in the corresponding equations during the associated calculations may be canceled, and therefore it is unnecessary to tune the voltage coefficients of this resistor in process during the manufacturing phase. In addition, according to some embodiments of the present invention, it is unnecessary to implement this resistor of these embodiments with a high power resistor, and this may greatly reduce the chip area and the associated costs in comparison with the related art. Additionally, according to some embodiments of the present invention, it is unnecessary to implement this resistor of these embodiments with an on-chip resistor.

Figure 5:
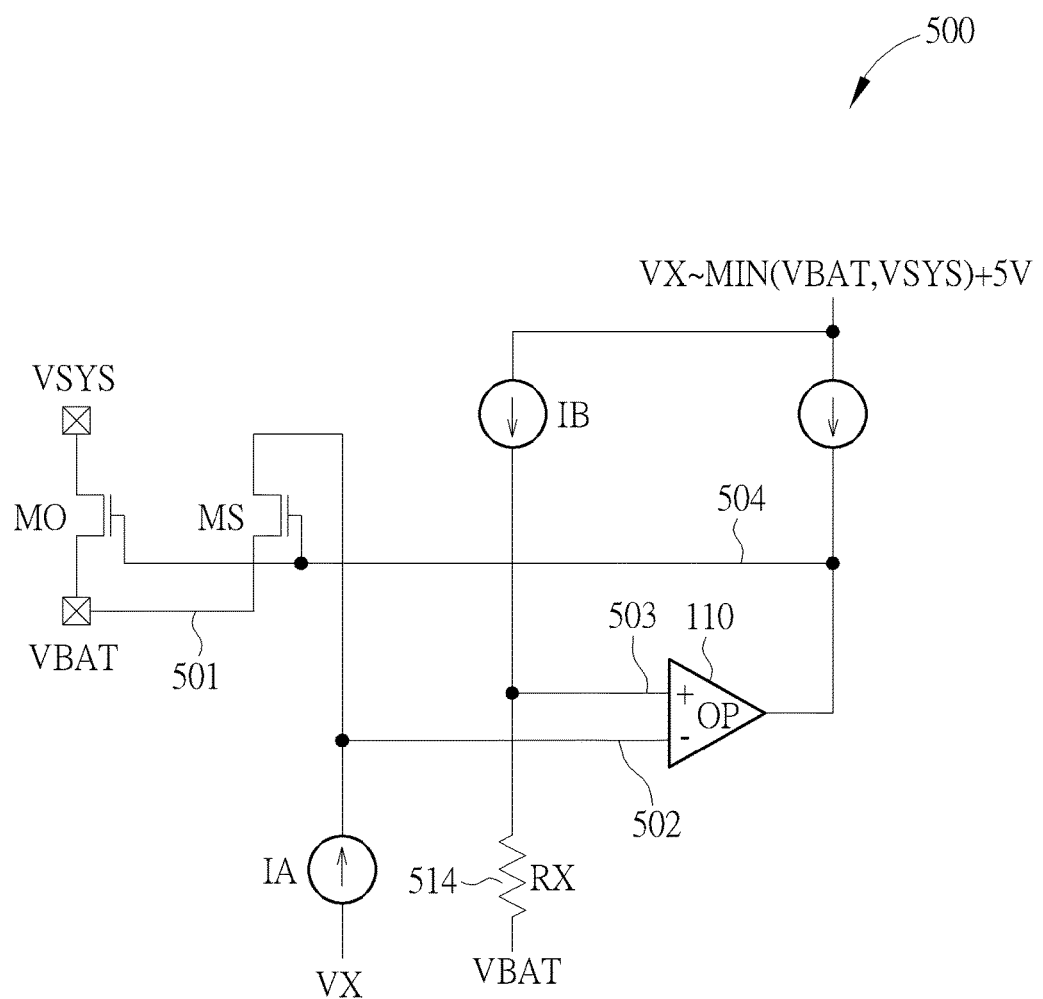
FIG. 5 is a diagram of an apparatus for performing resistance control on a current sensing component in an electronic device according to another embodiment of the present invention.

FIG. 5 is a diagram of an apparatus 500 for performing resistance control on a current sensing component in an electronic device according to another embodiment of the present invention, where the apparatus 500 may comprise at least one portion (e.g. a portion or all) of the electronic device. In comparison with the architecture shown in FIG. 1, the internal circuitry of the feedback module of this embodiment has been changed.

As shown in FIG. 5, the feedback module of this embodiment may comprise the power switching unit replica (e.g. the MOSFET MS) that receives a first voltage 501 at the battery terminal VBAT and outputs a second voltage 502, and the first current source IA, which is coupled between the power switching unit replica (e.g. the MOSFET MS) and a predetermined voltage terminal VX in this embodiment, where the first current source IA of this embodiment may be arranged to receive the second voltage 502 and operate according to a specific voltage at the predetermined voltage terminal, such as the specific voltage mentioned in some embodiments described above. In addition, the feedback module may further comprise a reference voltage generator that generates a third voltage 503, where the reference voltage generator of this embodiment may comprise a second current source IB and a resistor 514 that are connected in series and are coupled between the predetermined voltage terminal VX and the battery terminal VBAT, and the third voltage 503 is output from the terminal between the second current source IB and the resistor 514. For example, the resistor 514 may have the same resistance value as that of the first resistor RX, and therefore is labeled "RX" in FIG. 5 for better comprehension. This is for illustrative purposes only, and is not meant to be a limitation of the present invention. Additionally, the feedback module may further comprise the error amplifier 110 (e.g. an operational amplifier, labeled "OP" in FIG. 5 for better comprehension), which receives the second voltage 502 and the third voltage 503 and outputs a fourth voltage 504 in this embodiment, where the feedback module controls both of the power switching unit (e.g. the MOSFET MO) and the power switching unit replica (e.g. the MOSFET MS) according to the fourth voltage 504. Further, the feedback module may further comprise a pull-high component such as a third current source (e.g. the current source shown around the upper right corner of FIG. 5, such as the second current source of the embodiment shown in FIG. 1), and the pull-high component such as the third current source of this embodiment is coupled between the output terminal of the error amplifier 110 and the predetermined voltage terminal VX, where the pull-high component such as the third current source of this embodiment may be arranged to receive the fourth voltage 504 and operate according to the specific voltage at the predetermined voltage terminal VX. For example, the specific voltage is greater than the minimum within the first voltage 501 at the battery terminal VBAT and the fifth voltage at the system terminal VSYS (labeled "MIN(VBAT, VSYS)" in FIG. 5, for brevity). In practice, the apparatus 500 may generate the specific voltage to be the minimum plus the positive voltage such as 5 V. This is for illustrative purposes only, and is not meant to be a limitation of the present invention. According to some embodiments of the present invention, the positive voltage may vary. Examples of this positive voltage may include, but not limited to, 1 V, 2 V, 3 V, 4 V, or any of other voltage values. In the embodiment shown in FIG. 5, as the minimum plus the positive voltage such as that around 5 V is surely high enough to drive the pull-high component such as the third current source of this embodiment (e.g. the current source shown around the upper right corner of FIG. 5), when the specific voltage at the predetermined voltage terminal VX is approximately the minimum plus 5 V (labeled "VX~MIN (VBAT, VSYS)+5V" in FIG. 5, for brevity), the operations of the architecture shown in FIG. 5 will not be hindered. According to some embodiments of the present invention, the pull-high component of the apparatus 500 may be implemented with a resistor, where the third current source of the embodiment shown in FIG. 5 may be replaced by this resistor. For brevity, similar descriptions for these embodiments are not repeated in detail here.

As mentioned, the power switching unit (e.g. the MOSFET MO) may be utilized as the current sensing component when the power switching unit enables the power path, where the feedback module of the embodiment shown in FIG. 5 may track the temperature of the current sensing component and modulates the resistance of the current sensing component based on the tracked temperature. Please note that the output terminal of the error amplifier 110 shown in FIG. 5 is directly connected to the control terminal of the power switching unit, such as the gate of the MOSFET MO, and the feedback module regulates the resistance of the current sensing component, such as the on resistance of the MOSFET MO, by applying the fourth voltage 504 to the control terminal (e.g. the gate of the MOSFET MO). Thus, the apparatus 500 may use a single amplifier in the tracking loop of the feedback module (e.g. the error amplifier 110 shown in FIG. 5) to achieve the goal of better stability and TC performance.

According to some embodiments, as the current of the first current source IA and the current of the second current source IB may have positive correlation, the resistance of the MOSFET MS and the resistance value of the resistor 514 may have positive correlation.

Figure 6:
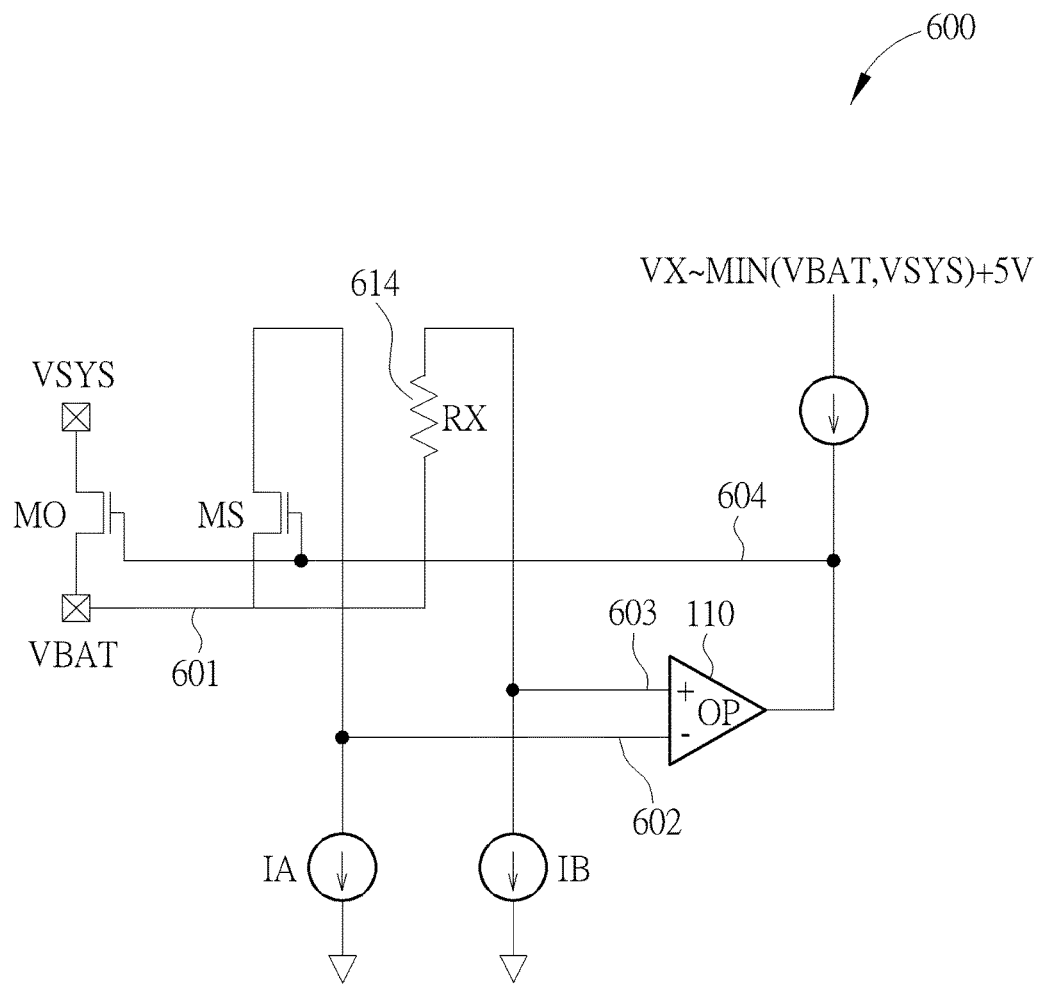
FIG. 6 is a diagram of an apparatus for performing resistance control on a current sensing component in an electronic device according to another embodiment of the present invention.

FIG. 6 is a diagram of an apparatus 600 for performing resistance control on a current sensing component in an electronic device according to another embodiment of the present invention, where the apparatus 600 may comprise at least one portion (e.g. a portion or all) of the electronic device. In comparison with the architecture shown in FIG. 1, the internal circuitry of the feedback module of this embodiment has been changed.

As shown in FIG. 6, the feedback module of this embodiment may comprise the power switching unit replica (e.g. the MOSFET MS) that receives a first voltage 601 at the battery terminal VBAT and outputs a second voltage 602, and the first current source IA, which is coupled between the power switching unit replica (e.g. the MOSFET MS) and the ground terminal in this embodiment, where the first current source IA of this embodiment may be arranged to receive the second voltage 602. In addition, the feedback module may further comprise a reference voltage generator that generates a third voltage 603, where the reference voltage generator of this embodiment may comprise a resistor 614 and the second current source IB that are connected in series and are coupled between the first voltage 601 and the ground terminal, and the third voltage 603 is output from the terminal between the resistor 614 and the second current source IB. For example, the resistor 614 may have the same resistance value as that of the first resistor RX, and therefore is labeled "RX" in FIG. 6 for better comprehension. This is for illustrative purposes only, and is not meant to be a limitation of the present invention. Additionally, the feedback module may further comprise the error amplifier 110 (e.g. an operational amplifier, labeled "OP" in FIG. 6 for better comprehension), which receives the second voltage 602 and the third voltage 603 and outputs a fourth voltage 604 in this embodiment, where the feedback module controls both of the power switching unit (e.g. the MOSFET MO) and the power switching unit replica (e.g. the MOSFET MS) according to the fourth voltage 604. Further, the feedback module may further comprise a pull-high component such as a third current source (e.g. the current source shown around the upper right corner of FIG. 6, such as the second current source of the embodiment shown in FIG. 1), and the pull-high component such as the third current source of this embodiment is coupled between the output terminal of the error amplifier 110 and the predetermined voltage terminal VX, where the pull-high component such as the third current source of this embodiment may be arranged to receive the fourth voltage 604 and operate according to the specific voltage at the predetermined voltage terminal VX. For example, the specific voltage is greater than the minimum within the first voltage 601 at the battery terminal VBAT and the fifth voltage at the system terminal VSYS (labeled "MIN (VBAT, VSYS)" in FIG. 6, for brevity). In practice, the apparatus 600 may generate the specific voltage to be the minimum plus the positive voltage such as 5 V. This is for illustrative purposes only, and is not meant to be a limitation of the present invention. According to some embodiments of the present invention, the positive voltage may vary. Examples of this positive voltage may include, but not limited to, 1 V, 2 V, 3 V, 4 V, or any of other voltage values. In the embodiment shown in FIG. 6, as the minimum plus the positive voltage such as that around 5 V is surely high enough to drive the pull-high component such as the third current source of this embodiment (e.g. the current source shown around the upper right corner of FIG. 6), when the specific voltage at the predetermined voltage terminal VX is approximately the minimum plus 5 V (labeled "VX~MIN(VBAT, VSYS)+5V" in FIG. 6, for brevity), the operations of the architecture shown in FIG. 6 will not be hindered. According to some embodiments of the present invention, the pull-high component of the apparatus 600 may be implemented with a resistor, where the third current source of the embodiment shown in FIG. 6 may be replaced by this resistor. For brevity, similar descriptions for these embodiments are not repeated in detail here.

As mentioned, the power switching unit (e.g. the MOSFET MO) may be utilized as the current sensing component when the power switching unit enables the power path, where the feedback module of the embodiment shown in FIG. 6 may track the temperature of the current sensing component and modulates the resistance of the current sensing component based on the tracked temperature. Please note that the output terminal of the error amplifier 110 shown in FIG. 6 is directly connected to the control terminal of the power switching unit, such as the gate of the MOSFET MO, and the feedback module regulates the resistance of the current sensing component, such as the on resistance of the MOSFET MO, by applying the fourth voltage 604 to the control terminal (e.g. the gate of the MOSFET MO). Thus, the apparatus 600 may use a single amplifier in the tracking loop of the feedback module (e.g. the error amplifier 110 shown in FIG. 6) to achieve the goal of better stability and TC performance.

According to some embodiments, as the current of the first current source IA and the current of the second current source IB may have positive correlation, the resistance of the MOSFET MS and the resistance value of the resistor 614 may have positive correlation.

Figure 7:
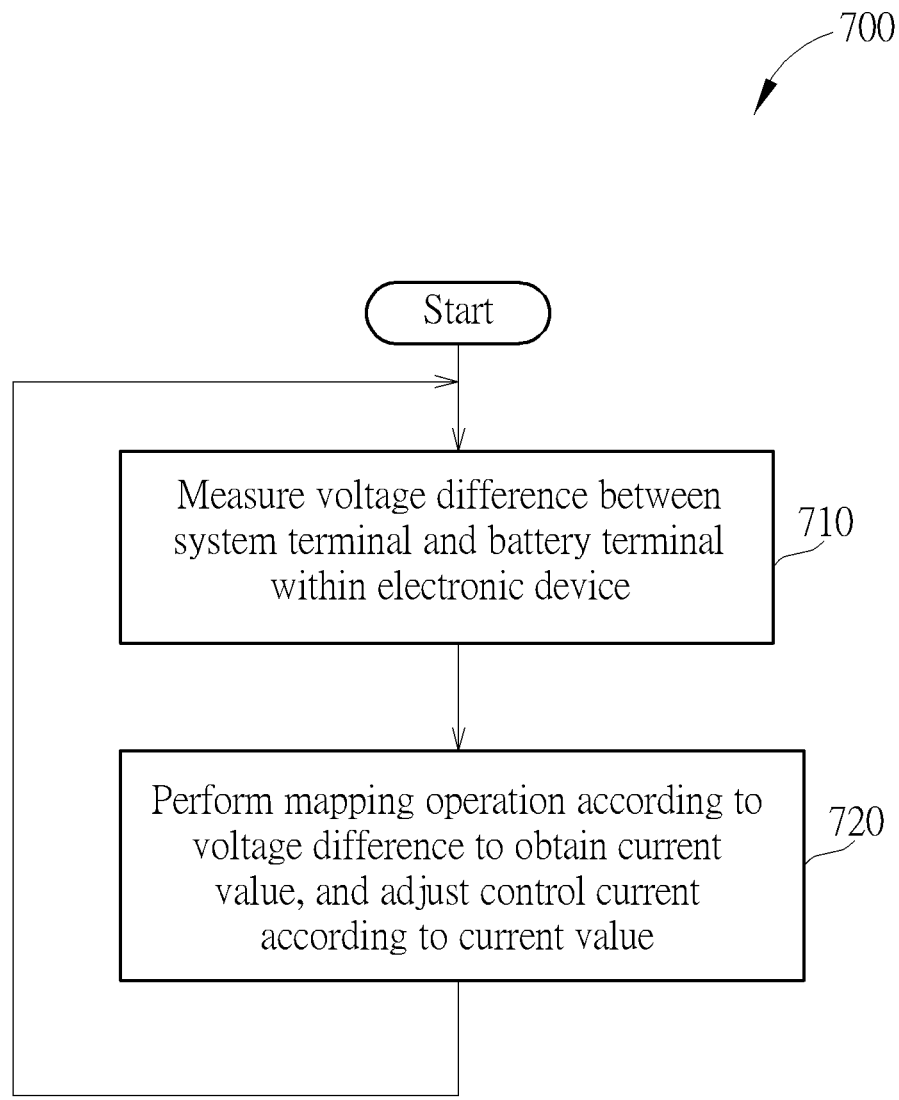
FIG. 7 illustrates a method for performing resistance control on a current sensing component in an electronic device according to an embodiment of the present invention.

FIG. 7 illustrates a method 700 for performing resistance control on a current sensing component in an electronic device according to an embodiment of the present invention, where the method 700 can be applied to the electronic device, and more particularly, can be applied to the apparatus 100 shown in FIG. 1.

In Step 710, the apparatus 100 (more particularly, a processing circuit therein) may measure a voltage difference between the system terminal VSYS and the battery terminal VBAT within the electronic device.

In Step 720, based on a set of calibration data, the apparatus 100 (more particularly, the processing circuit therein) may perform a mapping operation according to the voltage difference to obtain a current value (e.g. IA(n), where the notation "n" may represent an integer), and adjust the control current of the first current source IA (e.g. the current expressed with the corresponding notation thereof such as "IA" in some equations described above) according to the current value (e.g. IA(n)).

Figure 8:
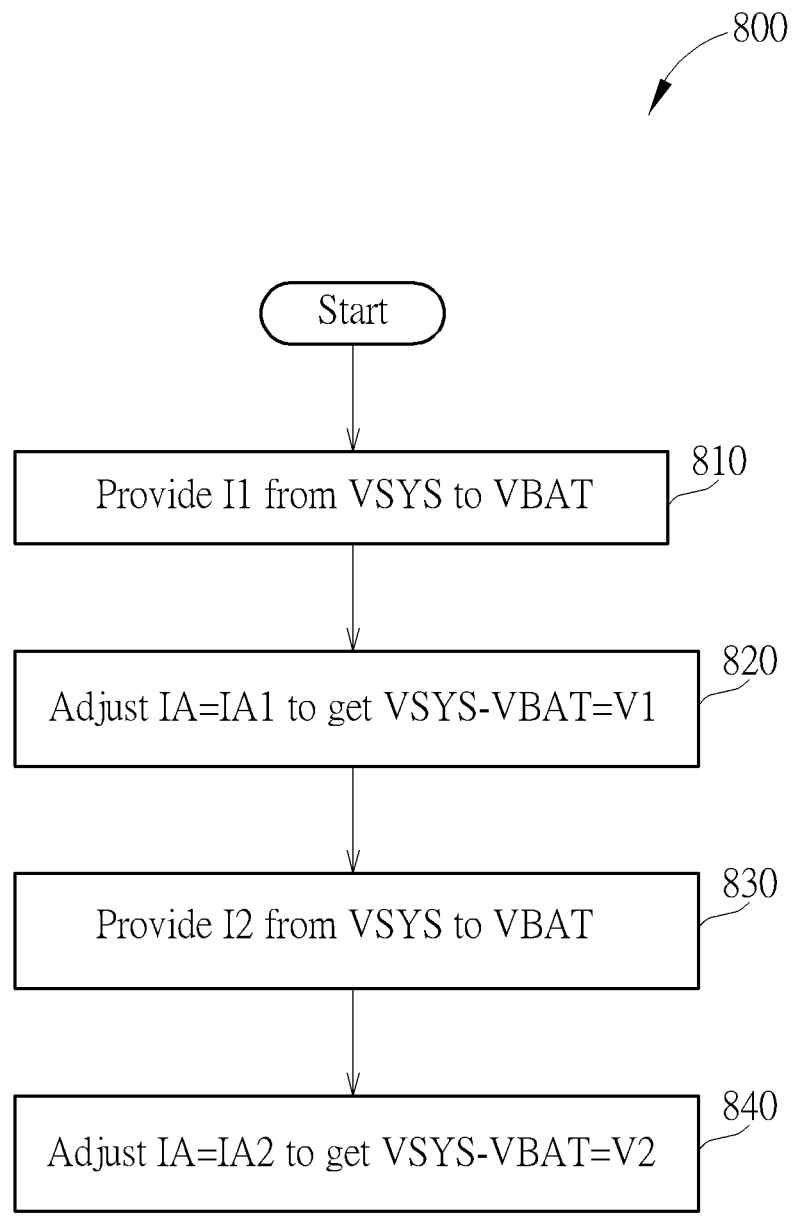
FIG. 8 illustrates a calibration flow involved with the method shown in FIG. 7 according to an embodiment of the present invention.

FIG. 8 illustrates a calibration flow 800 involved with the method 700 shown in FIG. 7 according to an embodiment of the present invention. According to this embodiment, the apparatus 100 (more particularly, the processing circuit therein) may performing calibration on the control current of the first current source IA in the calibration flow 800 to generate the set of calibration data.

In Step 810, the apparatus 100 (more particularly, the processing circuit therein) may provide the predetermined current I1 from the system terminal VSYS to the battery terminal VBAT.

In Step 820, the apparatus 100 (more particularly, the processing circuit therein) may adjust the control current of the first current source IA (e.g. the current expressed with the corresponding notation thereof such as "IA" in some equations described above) to be a predetermined current value IA1 (labeled "IA=IA1" in FIG. 8, for brevity) to get a voltage difference V1 between the system terminal VSYS and the battery terminal VBAT (labeled "VSYS−VBAT=V1" in FIG. 8, for brevity).

In Step 830, the apparatus 100 (more particularly, the processing circuit therein) may provide the predetermined current I2 from the system terminal VSYS to the battery terminal VBAT.

In Step 840, the apparatus 100 (more particularly, the processing circuit therein) may adjust the control current of the first current source IA (e.g. the current expressed with the corresponding notation thereof such as "IA" in some equations described above) to be a predetermined current value IA2 (labeled "IA=IA2" in FIG. 8, for brevity) to get a voltage difference V2 between the system terminal VSYS and the battery terminal VBAT (labeled "VSYS−VBAT=V2" in FIG. 8, for brevity).

According to this embodiment, the set of calibration data may comprise a first relationship between the predetermined current value IA1 and the voltage difference V1, and a second relationship between the predetermined current value IA2 and the voltage difference V2. This is for illustrative purposes only, and is not meant to be a limitation of the present invention. According to some embodiments, the set of calibration data may comprise a plurality of relationships between multiple predetermined current values (e.g. the predetermined current values IA1, IA2, etc.) and multiple voltage difference (e.g. the voltage difference V1, V2, etc.), respectively, where the number of relationships within the plurality of relationships may be greater than or equal to two.

Figure 9:
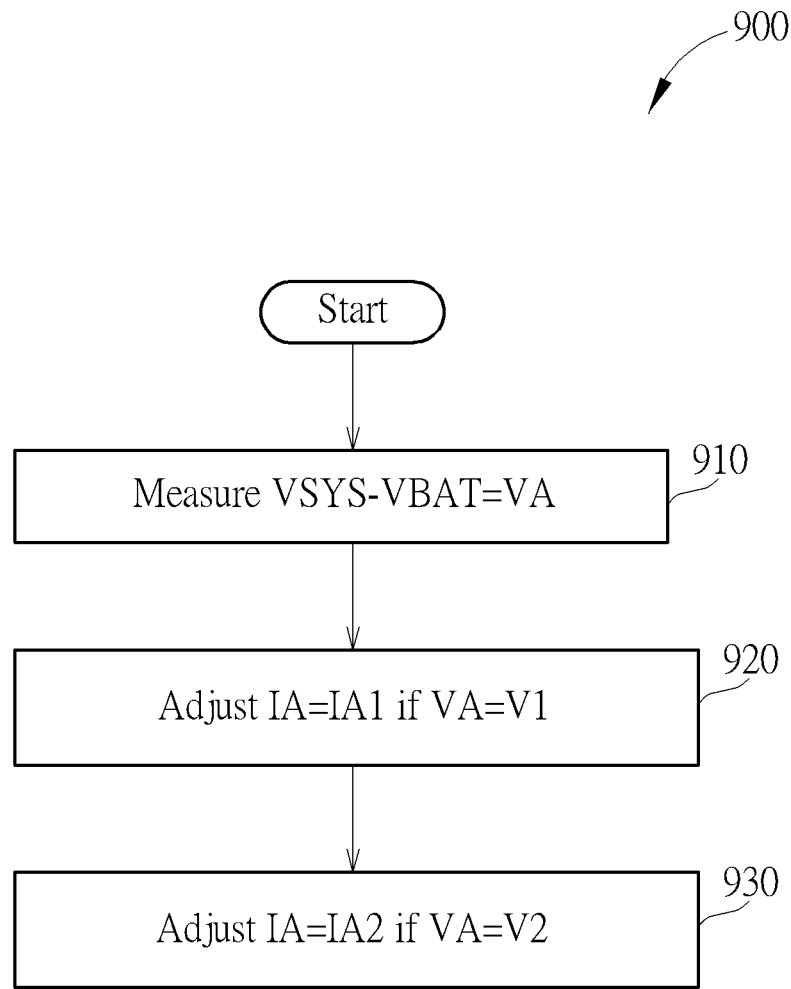
FIG. 9 illustrates an operation flow involved with the method shown in FIG. 7 according to an embodiment of the present invention.

FIG. 9 illustrates an operation flow 900 involved with the method 700 shown in FIG. 7 according to an embodiment of the present invention.

In Step 910, the apparatus 100 (more particularly, the processing circuit therein) may measure a voltage difference VA between the system terminal VSYS and the battery terminal VBAT (labeled "VSYS−VBAT=VA" in FIG. 9, for brevity).

In Step 920, the apparatus 100 (more particularly, the processing circuit therein) may adjust the control current of the first current source IA (e.g. the current expressed with the corresponding notation thereof such as "IA" in some equations described above) to be the predetermined current value IA1 (labeled "IA=IA1" in FIG. 9, for brevity) if the measured voltage difference VA is equivalent to the voltage difference V1 (labeled "VA=V1" in FIG. 9, for brevity).

In Step 930, the apparatus 100 (more particularly, the processing circuit therein) may adjust the control current of the first current source IA (e.g. the current expressed with the corresponding notation thereof such as "IA" in some equations described above) to be the predetermined current value IA2 (labeled "IA=IA2" in FIG. 9, for brevity) if the measured voltage difference VA is equivalent to the voltage difference V2 (labeled "VA=V2" in FIG. 9, for brevity).

According to this embodiment, the set of calibration data may comprise the first relationship between the predetermined current value IA1 and the voltage difference V1, and the second relationship between the predetermined current value IA2 and the voltage difference V2. This is for illustrative purposes only, and is not meant to be a limitation of the present invention. According to some embodiments, the set of calibration data may comprise the plurality of relationships between the multiple predetermined current values (e.g. the predetermined current values IA1, IA2, etc.) and the multiple voltage difference (e.g. the voltage difference V1, V2, etc.), respectively, where the number of relationships within the plurality of relationships may be greater than or equal to two. For example, during the calibration flow 800, a set of voltage differences between the system terminal VSYS and the battery terminal VBAT are measured, with a set of predetermined current values of the power path being applied, respectively. As a result of increasing the number of relationships within the set of calibration data, the control in the operation flow 900 may become more accurate. According to some embodiments, the calibration performed in the calibration flow 800 may make sure the on resistance (Ron) accuracy during the operation flow 900.

According to some embodiments, as the number of relationships within the set of calibration data is great, the operations in the operation flow 900 may be performed with aid of a look up table associated to the set of calibration data. For brevity, similar descriptions for this embodiment are not repeated in detail here.

FIG. 10 illustrates a calibration curve involved with the method 700 shown in FIG. 7 according to an embodiment of the present invention, where the horizontal axis may represent the voltage difference between the system terminal VSYS and the battery terminal VBAT (labeled "VSYS−VBAT" in FIG. 10, for better comprehension), and the vertical axis may represent the control current of the first current source IA (e.g. the current expressed with the corresponding notation thereof such as "IA" in some equations described above, and is therefore labeled "IA" in FIG. 10, for better comprehension).

Figure 10:
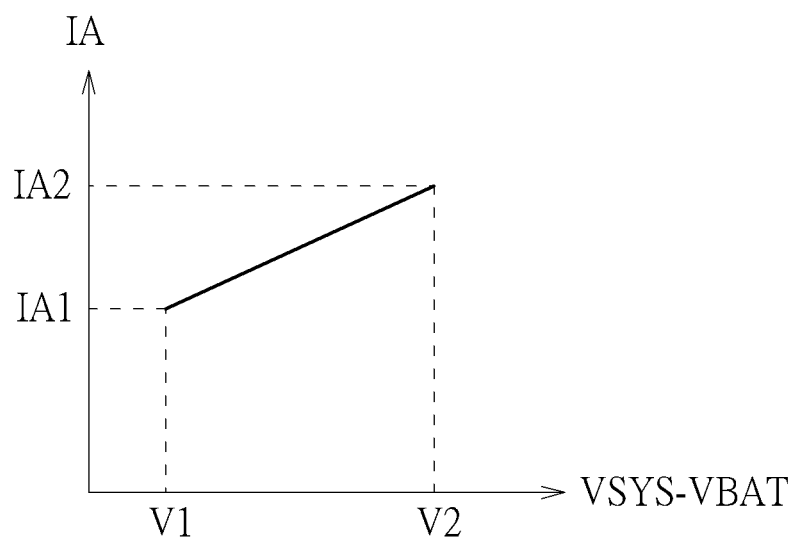
FIG. 10 illustrates a calibration curve involved with the method 700 shown in FIG. 7 according to an embodiment of the present invention.

According to this embodiment, the calibration curve may indicate the plurality of relationships between the multiple predetermined current values (e.g. the predetermined current values IA1, IA2, etc.) and the multiple voltage difference (e.g. the voltage difference V1, V2, etc.), respectively. For example, the set of calibration data may comprise the first relationship between the predetermined current value IA1 and the voltage difference V1, and the second relationship between the predetermined current value IA2 and the voltage difference V2. As shown in FIG. 10, the two points (V1, IA1) and (V2, IA2) may be positioned at the two ends of this curve. This is for illustrative purposes only, and is not meant to be a limitation of the present invention. According to some embodiments, one or both of the two points (V1, IA1) and (V2, IA2) may be intermediate points on the curve. According to some embodiments, the curve may be extended.

According to some embodiments, curve fitting may be applied according to the raw data obtained from the calibration flow 800, to expand the set of calibration data. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing resistance control on a current sensing component in an electronic device, the apparatus comprising at least one portion of the electronic device, the apparatus comprising:

a power switching unit, positioned within the electronic device, arranged to selectively enable or disable a power path between a system terminal and a battery terminal within the electronic device, wherein the system terminal is utilized for coupling a main system circuit of the electronic device, and the battery terminal is utilized for coupling a battery of the electronic device, wherein the power switching unit is utilized as the current sensing component when the power switching unit enables the power path, and the current sensing component measures current on the power path;

a feedback module, coupled to the power switching unit and positioned within the electronic device, wherein the feedback module comprises:

a power switching unit replica that receives a first voltage at the battery terminal and outputs a second voltage;

a first current source, coupled between the power switching unit replica and a ground terminal, arranged to receive the second voltage;

a reference voltage generator that generates a third voltage;

an error amplifier that receives the second voltage and the third voltage and outputs a fourth voltage from an output terminal of the error amplifier, wherein the output terminal of the error amplifier is directly connected to both of a control terminal of the power switching unit and a control terminal of the power switching unit replica, and the feedback module controls both of the power switching unit and the power switching unit replica according to the fourth voltage; and a pull-high component, coupled between the output terminal of the error amplifier and a predetermined voltage terminal, arranged to receive the fourth voltage and operate according to a specific voltage at the predetermined voltage terminal.

2. The apparatus of claim 1, wherein the specific voltage is greater than a minimum within the first voltage and a fifth voltage at the system terminal; and the pull-high component is a second current source or a resistor.

3. The apparatus of claim 1, wherein the feedback module tracks a temperature of the current sensing component and modulates resistance of the current sensing component based on the tracked temperature.

4. The apparatus of claim 1, wherein the feedback module regulates resistance of the current sensing component by applying the fourth voltage outputted from the output terminal of the error amplifier to both of the control terminal of the power switching unit and the control terminal of the power switching unit replica.

5. The apparatus of claim 1, wherein the power switching unit replica comprises a first Metal Oxide Semiconductor Field Effect Transistor (MOSFET).

6. The apparatus of claim 1, wherein the reference voltage generator comprises:

a reference output terminal, for outputting a reference voltage, wherein the reference voltage is utilized as the third voltage; and a first resistor and a third current source that are connected in series, wherein the first resistor is coupled between the battery terminal and the reference output terminal, and the third current source is coupled between the reference output terminal and a ground terminal.

7. The apparatus of claim 6, wherein the third current source comprises:

a second Metal Oxide Semiconductor Field Effect Transistor (MOSFET) and a second resistor that are connected in series;

a second amplifier that receives the third voltage as a reference signal and monitors a monitoring input signal at a terminal between the second MOSFET and the second resistor and controls a gate of the second MOSFET with an output signal of the second amplifier; and a current conversion circuit, coupled to the second MOSFET, arranged to control current of the third current source according to current passing through the second MOSFET.

8. The apparatus of claim 1, wherein the first current source comprises:

a third Metal Oxide Semiconductor Field Effect Transistor (MOSFET) and a third resistor that are connected in series;

a third amplifier that receives the third voltage as a reference signal and monitors a monitoring input signal at a terminal between the third MOSFET and the third resistor and controls a gate of the third MOSFET with an output signal of the third amplifier; and a current conversion circuit, coupled to the third MOSFET, arranged to control current of the first current source according to current passing through the third MOSFET.

9. A method for performing resistance control on a current sensing component in an electronic device, comprising:

measuring a voltage difference between a system terminal and a battery terminal within the electronic device, wherein a power switching unit positioned within the electronic device is arranged to selectively enable or disable a power path between the system terminal and the battery terminal within the electronic device, the system terminal is utilized for coupling a main system circuit of the electronic device, and the battery terminal is utilized for coupling a battery of the electronic device, wherein the power switching unit is utilized as the current sensing component with the power switching unit enabling the power path, and the current sensing component measures current on the power path; and based on a set of calibration data, performing a mapping operation according to the voltage difference to obtain a current value, and adjust a control current of a first current source according to the current value, wherein a feedback module coupled to the power switching unit and positioned within the electronic device comprises a power switching unit replica that receives a first voltage at the battery terminal and outputs a second voltage, the first current source that is coupled between the power switching unit replica and a ground terminal and is arranged to receive the second voltage, a reference voltage generator that generates a third voltage, an error amplifier that receives the second voltage and the third voltage and outputs a fourth voltage from an output terminal of the error amplifier, and a pull-high component that is coupled between the output terminal of the error amplifier and a predetermined voltage terminal and is arranged to receive the fourth voltage and operate according to a specific voltage at the predetermined voltage terminal, wherein the output terminal of the error amplifier is directly connected to both of a control terminal of the power switching unit and a control terminal of the power switching unit replica, and the feedback module is arranged to control both of the power switching unit and the power switching unit replica according to the fourth voltage.

10. The method of claim 9, further comprising:

performing calibration on the control current of the first current source in a calibration flow to generate the set of calibration data.

11. An apparatus for performing resistance control on a current sensing component in an electronic device, the apparatus comprising at least one portion of the electronic device, the apparatus comprising:

a power switching unit, positioned within the electronic device, arranged to selectively enable or disable a power path between a system terminal and a battery terminal within the electronic device, wherein the system terminal is utilized for coupling a main system circuit of the electronic device, and the battery terminal is utilized for coupling a battery of the electronic device, wherein the power switching unit is utilized as the current sensing component when the power switching unit enables the power path, and the current sensing component measures current on the power path;

a feedback module, coupled to the power switching unit and positioned within the electronic device, wherein the feedback module comprises:

a power switching unit replica that receives a first voltage at the battery terminal and outputs a second voltage;

a first current source, coupled between the power switching unit replica and a predetermined voltage terminal, arranged to receive the second voltage and operate according to a specific voltage at the predetermined voltage terminal;

a reference voltage generator that generates a third voltage, wherein the reference voltage generator comprises a second current source and a resistor that are connected in series and are coupled between the predetermined voltage terminal and the battery terminal, wherein the third voltage is output from a terminal between the second current source and the resistor;

an error amplifier that receives the second voltage and the third voltage and outputs a fourth voltage from an output terminal of the error amplifier, wherein the output terminal of the error amplifier is directly connected to both of a control terminal of the power switching unit and a control terminal of the power switching unit replica, and the feedback module controls both of the power switching unit and the power switching unit replica according to the fourth voltage; and a pull-high component, coupled between the output terminal of the error amplifier and the predetermined voltage terminal, arranged to receive the fourth voltage and operate according to the specific voltage.

12. The apparatus of claim 11, wherein the specific voltage is greater than a minimum within the first voltage and a fifth voltage at the system terminal; and the pull-high component is a third current source or a resistor.

13. The apparatus of claim 11, wherein the feedback module tracks a temperature of the current sensing component and modulates resistance of the current sensing component based on the tracked temperature.

14. The apparatus of claim 11, wherein the feedback module regulates resistance of the current sensing component by applying the fourth voltage outputted from the output terminal of the error amplifier to both of the control terminal of the power switching unit and the control terminal of the power switching unit replica.

15. The apparatus of claim 11, wherein current of the first current source and current of the second current source have positive correlation, and resistance of the power switching unit replica and resistance of the resistor have positive correlation.

16. An apparatus for performing resistance control on a current sensing component in an electronic device, the apparatus comprising at least one portion of the electronic device, the apparatus comprising:

a power switching unit, positioned within the electronic device, arranged to selectively enable or disable a power path between a system terminal and a battery terminal within the electronic device, wherein the system terminal is utilized for coupling a main system circuit of the electronic device, and the battery terminal is utilized for coupling a battery of the electronic device, wherein the power switching unit is utilized as the current sensing component when the power switching unit enables the power path, and the current sensing component measures current on the power path;

a feedback module, coupled to the power switching unit and positioned within the electronic device, wherein the feedback module comprises:

a power switching unit replica that receives a first voltage at the battery terminal and outputs a second voltage;

a first current source, coupled between the power switching unit replica and a ground terminal, arranged to receive the second voltage;

a reference voltage generator that generates a third voltage, wherein the reference voltage generator comprises a resistor and a second current source that are connected in series and are coupled between the first voltage and the ground terminal, wherein the third voltage is output from a terminal between the resistor and the second current source;

an error amplifier that receives the second voltage and the third voltage and outputs a fourth voltage from an output terminal of the error amplifier, wherein the output terminal of the error amplifier is directly connected to both of a control terminal of the power switching unit and a control terminal of the power switching unit replica, and the feedback module controls both of the power switching unit and the power switching unit replica according to the fourth voltage; and a pull-high component, coupled between the output terminal of the error amplifier and a predetermined voltage terminal, arranged to receive the fourth voltage and operate according to a specific voltage at the predetermined voltage terminal.

17. The apparatus of claim 16, wherein the specific voltage is greater than a minimum within the first voltage and a fifth voltage at the system terminal; and the pull-high component is a third current source or a resistor.

18. The apparatus of claim 16, wherein the feedback module tracks a temperature of the current sensing component and modulates resistance of the current sensing component based on the tracked temperature.

19. The apparatus of claim 16, wherein the feedback module regulates resistance of the current sensing component by applying the fourth voltage outputted from the output terminal of the error amplifier to both of the control terminal of the power switching unit and the control terminal of the power switching unit replica.

20. The apparatus of claim 16, wherein current of the first current source and current of the second current source have positive correlation, and resistance of the power switching unit replica and resistance of the resistor have positive correlation.

* * * * *